United States Patent [19]

Ward et al.

[11] Patent Number: 5,034,612
[45] Date of Patent: Jul. 23, 1991

[54] ION SOURCE METHOD AND APPARATUS

[75] Inventors: Billy W. Ward, Rockport, Mass.; Randall G. Percival, Raymond, N.H.

[73] Assignee: Micrion Corporation, Peabody, Mass.

[21] Appl. No.: 622,178

[22] Filed: Dec. 3, 1990

Related U.S. Application Data

[63] Continuation of Ser. No. 358,403, May 26, 1989, abandoned.

[51] Int. Cl.$^5$ .............................................. H01J 27/00
[52] U.S. Cl. ............................. 250/423 R; 250/423 F; 250/424; 313/230; 313/359.1; 313/361.1; 313/363.1
[58] Field of Search ............... 250/423 R, 423 F, 398; 313/230, 359.1, 360.1, 361.1, 362.1, 363.1

[56] References Cited

U.S. PATENT DOCUMENTS

| | | | |
|---|---|---|---|
| 4,328,667 | 5/1982 | Valentian et al. | 250/423 F |
| 4,367,429 | 1/1983 | Wang et al. | 250/423 R |
| 4,549,082 | 10/1985 | McMillan | 250/423 R |
| 4,567,398 | 1/1986 | Ishitani et al. | 250/423 R |
| 4,687,940 | 8/1987 | Ward et al. | 250/398 |
| 4,752,692 | 6/1988 | Jergenson et al. | 250/423 R |
| 4,774,414 | 9/1988 | Umemura | 250/423 R |
| 4,846,953 | 7/1989 | Yoshida | 250/423 R |

FOREIGN PATENT DOCUMENTS 0037455 10/1981 European Pat. Off.
58-137943 8/1983 Japan.
58-142738 8/1983 Japan.

Primary Examiner—Jack I. Berman
Assistant Examiner—Kiet T. Nguyen
Attorney, Agent, or Firm—Lahive & Cockfield

[57] ABSTRACT

Ion source methods and apparatus include an ion generating element for providing a reservoir of flowing liquid source material, accelerating elements for providing an electric field around the ion generating element, and shielding elements. The shielding element is constructed from a material including atoms which, if backsputtered onto the ion generating element, do not substantially degrade ion source performance.

15 Claims, 1 Drawing Sheet

LIQUID METAL ION SOURCE, 10

ION SOURCE METHOD AND APPARATUS

This application is a continuation of application Ser. No. 358,403, filed May 26, 1989 now abandoned.

BACKGROUND OF THE INVENTION

This invention relates generally to ion source methods and apparatus, and, more particularly, relates to apparatus and methods for providing enhanced liquid metal ion source life and beam current stability.

Liquid metal ion sources have been employed in a variety of electrostatic optical systems in recent years. Such systems are utilized in a variety of applications, including ion beam lithography and direct ion implantation in such fields as semiconductor processing, ion mass spectrometry, and sub-micron machining.

In many ion beam-based processes, such as photomask and circuit repair, and maskless ion implantation, ion beam current and impingement position must be carefully controlled, requiring highly stable ion beam currents. A typical liquid metal ion column includes an ion source, which generates ions from a selected liquid metal, and one or more downstream electrodes to generate and focus an ion beam from the ions provided by the ion source. The ion beam impinges on a work piece to perform the required application.

Ion beam instabilities often result, however, from the liquid metal ion source itself. A conventional gallium liquid metal ion source, for example, includes a tungsten filament wetted by a gallium film. In this configuration, ion emission is a function of the constant supply of gallium to the filament tip, which sustains the characteristic "Taylor cone." This source flow propagates through a thin film, which, if interrupted or reduced in thickness, can destabilize ion beam current and reduce ion source life.

Degradation of source flow can result from "backsputtering," a process in which ions from the ion source strike downstream elements, sputtering off particles that, in turn, strike the ion source. These backsputtered particles can adversely affect liquid metal ion source performance, including source life and short- and long-term ion beam current stability.

It is thus an object of the invention to provide ion source methods and apparatus affording enhanced source life.

If is another object of the invention to provide such ion source methods and apparatus which afford improved short- and long-term ion beam current stability.

Other general and specific objects of the invention will in part be obvious and will in part appear hereinafter.

SUMMARY OF THE INVENTION

The foregoing objects are attained by the invention, which provides ion source methods and apparatus, including an ion generating element for providing a reservoir of flowing liquid source material, accelerating elements for providing an electric field around the ion generating element, and shielding elements. The term "shielding elements," as defined herein, includes, but is not limited to optical and other elements, and beamforming or -defining elements. The ion generating element, accelerating elements and shielding elements generate an ion beam normally having a selected ion current. In particular, the ion beam is defined from ions generated in a known manner by cooperation of the ion generating element and accelerating elements.

One aspect of the invention includes constructing the ion generating element to include at least a first selected source material, and configuring at least a first shielding element from a selected material. In particular, the shielding element material is selected to include atoms of elements which, if backsputtered onto the ion generating element, do not substantially degrade ion source performance. The shielding element material can include atoms capable of alloying with the liquid source metal so that ion source performance is not degraded, or atoms which, if backsputtered onto the ion generating element, accrete to form a structure having a selected microstructure so that ion source performance is not degraded.

Another aspect of the invention includes selecting a shield element material including atoms which, if backsputtered onto the ion generating element, do not substantially modify the electric field characteristics of the ion generating element, accelerating elements, and shielding elements, collectively; or which do not alter the flow of liquid source material about the ion generating element; or which accrete to form a structure having a substantially porous microstructure.

The shielding element material can be one which forms a solution when alloyed with the selected source metal, the solution having a melting point which does not substantially degrade ion source performance, such as by resulting in partial or complete source solidification at operation temperatures.

In accordance with the invention, if the ion generating element includes gallium, the shielding element material can be selected to include any of tungsten, tin, molybdenum, or indium. The shield elements can include silicon and gold alloy components. Alternatively, the shielding element material can include chemical elements identical to those of the liquid source material.

Additionally, the shielding element can be constructed from layers or sectors of different selected materials, each sector including atoms of elements which, if backsputtered onto the ion generating element, do not substantially degrade ion source performance.

The invention will next be described in connection with certain illustrated embodiments; however, it should be clear to those skilled in the art that various modifications, additions and subtractions can be made without departing from the spirit or scope of the claims.

BRIEF DESCRIPTION OF THE DRAWING

For a fuller understanding of the nature and objects of the invention, reference should be made to the following detailed description and the accompanying drawings, in which.

DESCRIPTION OF ILLUSTRATED EMBODIMENTS

Figure 1:
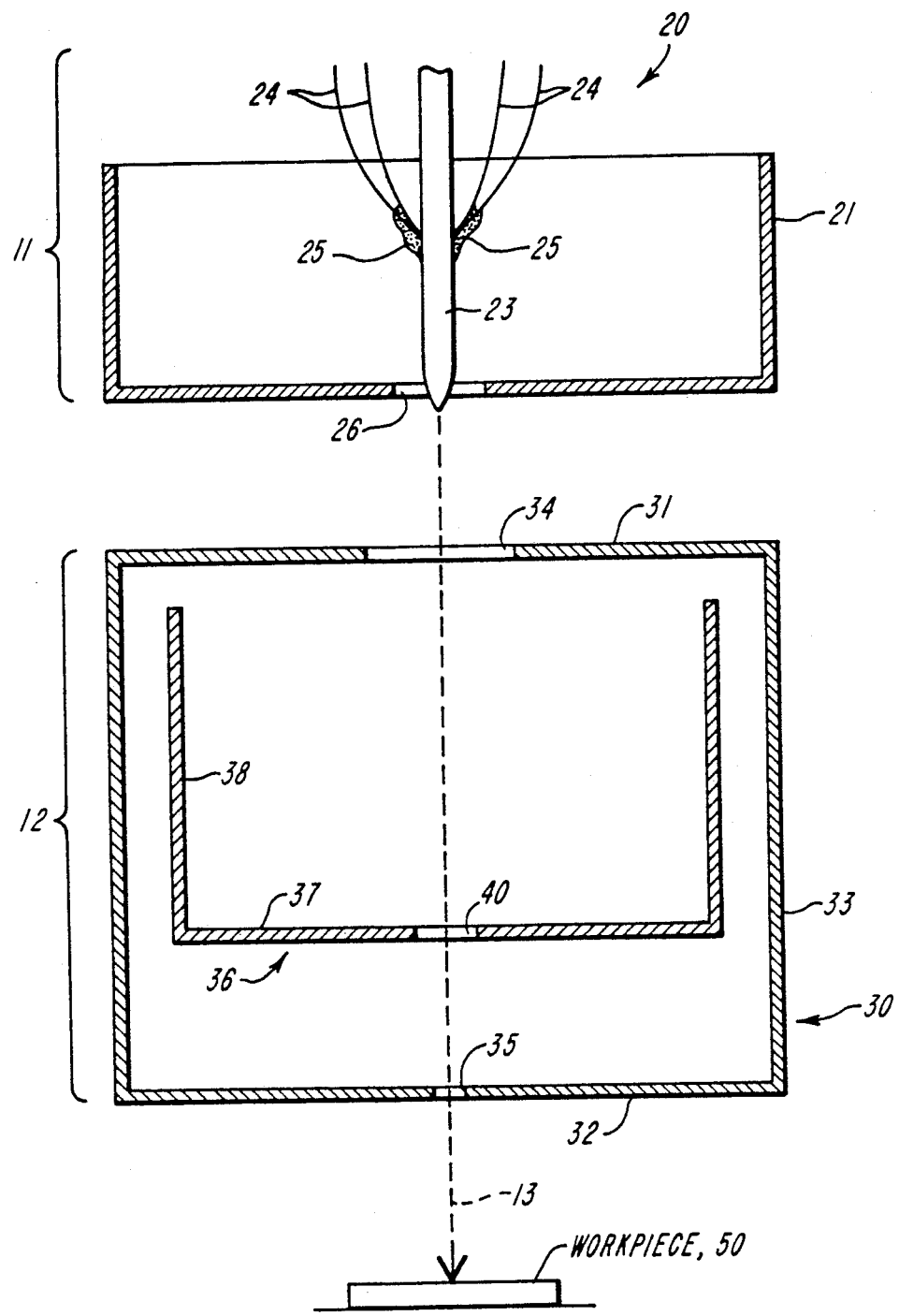
FIG. 1 is a schematic diagram depicting an ion source assembly constructed in accordance with the invention.

FIG. 1 depicts an ion source assembly constructed in accordance with the invention. With reference to FIG. 1, liquid metal source 10 includes an ion supply portion 11, which generates liquid metal ions, and an accelerating electrode portion 12. The accelerating electrode portion 12 provides an attractive force to extract and accelerate ions produced by ion supply portion 11 to induce them to flow in a beam along a path, depicted by a dotted line identified by reference numeral 13, toward a work piece 50.

Depending on the application in which the liquid metal ion source 10 is utilized, the beam may, for example, be employed to etch the work piece or form implant ions in the work piece. In addition, depending on the application in which the liquid metal ion source 10 is used, an apparatus including the source 10 may include other electrodes or similar structures downstream of the accelerating electrode portion 12 along path 13, which may be used to further accelerate or shape the ion beam, or for other conventional purposes.

The ion supply portion 11 includes a metal source 20 which comprises a source of liquid metal, and an ion current control electrode 21. The metal source 20, in turn, includes a needle arrangement 22 comprising a generally vertical needle 23 to which a plurality of fine wires 24 are attached, by, for example, spot welding.

The fine wires 24 are generally upwardly-extending from the point at which they join to the needle 23 so that, when they are dipped into a liquid metal, the metal flows downwardly to collect at the junctions between the wires and form small spheroids 25, thereby forming a reservoir of liquid metal. During operation, the liquid metal flows in a film from the junction between the wires 24 and the needle 23 toward the tip of the needle 23, where it is attracted by the extracting and accelerating electrode portion 12 off the needle and ionized. The sidewalls of the needle 23 may be grooved to facilitate flow of the liquid metal 23 over the needle 23.

The extracting and accelerating electrode portion 12 comprises and electrode element 30 defining two plates 31 and 32 maintained a predetermine distance apart by a generally cylindrical sidewall 33. The plates 31 and 32, which are generally parallel and orthogonal to the ion beam path 13, define respective apertures 34 and 35, both of which are centered along the ion beam path 13. The electrode element 30, in particular plate 31, is charged so as to create an electric field between it and the needle 23 to extract and attract the ions formed by the ion supply portion 11 from the tip of the needle 23. Aperture 35, which is farther along the ion beam path 13 from aperture 34, is smaller than aperture 34 to thereby produce a narrow collimated ion beam along the path 13.

The extracting and accelerating electrode portion 12 further includes a shield 36 situated interiorly of the electrode element 30 and between the two plates 31 and 32 of the electrode element 30. The ions departing the tip of needle 23 generally form a cone—referred to as a "Taylor cone"—whose tip is situated at the tip of the needle 23 and which is symmetric around the ion beam path 13. The shield 36 generally shields the interior of the accelerating electrode portion 12 from ions in the ion beam which diverge from the ion beam path 13.

To shield the interior of the accelerating electrode portion 12 from the portions of the ion beam that diverge substantially from the beam path 13, the shield 36 includes a plate portion 37 and a generally cylindrical sidewall 38. The shield 36 may be supported within the electrode element 30 by a conventional mount (not shown) comprising an electrically conductive material. The plate portion 37 is generally parallel to the plates 31 and 32, and defines an aperture 40 which is generally centered on the ion beam path 13. The aperture 40 has a diameter somewhat larger than that of aperture 35, but smaller than that of aperture 34.

The ion beam column elements identified above can be referred to generically as "shielding elements," which, as defined herein, includes, but is not limited to, optical and other elements, and beam-forming or -defining elements. In conventional ion gun configurations, these shield elements include extractor and aperture surfaces which, during operation, act as sources of contaminant material. In particular, ion source performance, including source life and short- and long-term ion beam current stability, is degraded by backsputtered contamination from these elements. Short term source stability is typically measured over a period of minutes to hours, while long-term stability is typically measured of a period of hours to hundreds of hours. Backsputtered contamination can result in source failure, through reduction of source film—such as gallium film—thickness, or by the accretion of material at the active region of the source, typically the apex.

Referring to FIG. 1, the backsputtering problem typical of conventional sources arises in connection with, in particular, the extracting and accelerating electrode portion 12, since ions diverging from the ion beam may impact on the shield 36, and the portions of the plate 37 of shield 36 proximate the aperture 40. Such diverging ions may cause material from the shield 36 to be sputtered off, which can flow back to and land on the needle 23 proximate the tip.

Material migrating to the needle 23 can have a number of deleterious consequences in the operation of the liquid metal ion source 10. For example, the material, on landing on the needle 23, can form crystals that obstruct the flow of liquid metal to the needle tip, reducing the density of the ion beam. In addition, the crystalline material can alter the electrostatic characteristics of the needle, resulting in a change in the electric field characteristics as among the needle, ion current control electrode 21 and the extracting and accelerating electrode portion 12.

We have discovered that the deleterious effects of backsputtering from the shield 36 can be alleviated by a particular selection of the type of material comprising the shield 36. By selecting appropriate materials for the construction of these components, the stability of ion beam currents, as well as source life, can be substantially improved.

In particular, we have discovered that source performance, including life and current stability, is improved if the material comprising the shield 36 satisfies one of the following criteria:

(1) that the material includes atoms which, upon backsputtering, alloy with the liquid source material, with the alloy remaining liquid at the operating temperature of the liquid metal ion source 10; or (2) if the material does not alloy with the liquid source material, that it forms a crystal or other structure which does not impede the flow of the liquid metal toward the tip of the needle 23, or change the geometric configuration of the needle so as to disturb the electrostatic characteristics of the needle 23.

The second criterion may be satisfied if the shield material forms a structure on needle 23 that is, for example, porous to the liquid metal.

We have further discovered illustrative materials for each of these criteria, for a liquid metal ion source 10 in which gallium comprises the liquid metal. When tungsten is utilized in a shield element in conjunction with a gallium source element, for example, the backsputtered atoms form a microstructure on the source surface which does not substantially reduce ion emission stability and life. Moreover, materials which form a lower melting point solution when mixed with gallium, such as indium and tin, can yield stable source operation and longer lifetimes. Similarly, molybdenum or gallium itself can be utilized in the shield structure to maintain ion source performance.

Referring now to FIG. 1, if the shield material comprises tin, the tin will alloy with the gallium if it is sputtered off the shield 36 and lands on the needle 23, and the alloy will remain liquid at, for example, room temperature, thereby satisfying criterion (1). Further, if the shield material comprises tungsten, the tungsten which lands on the needle 23 will form generally porous spherical nodules thereon which does not substantially impede the flow of gallium along the needle, thereby satisfying criterion (2). Thus, fabrication of the shield 36 from either tin or tungsten will result in a liquid metal ion source which does not experience the performance degradation typical of prior liquid metal ion sources utilizing conventionally selected materials for the shield 36.

It will be appreciated that other materials may be used in shield 36 which satisfy one of the above-identified criteria. In addition, it will be appreciated that the particular materials that are selected for use in the shield 36 will depend upon the particular liquid metal that is used in the liquid metal ion source 10. Thus, for example, the shield elements can include silicon and gold alloy components which satisfy the above criteria.

It will further be appreciated that other portions of the liquid metal ion source 10, particularly portions of the extracting and accelerating electrode portion 12, may also give rise to backsputtered material that can strike the needle 23 and adversely effect its operation. Thus, those portions of the source 10 may also be fabricated from material satisfying the above-identified criteria to alleviate the adverse effects identified above.

In accordance with the invention, in summary, the shielding element material can be selected to include atoms of elements which, if backsputtered onto the ion generating element, do not substantially degrade ion source performance. The shielding element material can include atoms capable of alloying with the liquid source metal so that ion source performance is not degraded, or atoms which, if backsputtered onto the ion generating element, accrete to form a structure having a selected microstructure so that ion source performance is not degraded. More particularly, the shield element material can include atoms which, if backsputtered onto the ion generating element, do not substantially modify the electric field characteristics of the ion generating element, accelerating elements, and shielding elements, collectively; or which do not alter the flow of liquid source material about the ion generating element; or which accrete to form a structure having a substantially porous microstructure.

The shielding element material can be one which forms a solution when alloyed with the selected source metal, the solution having a melting point which does not substantially degrade ion source performance, such as by resulting in partial or complete source solidification at operation temperatures.

If the ion generating element includes gallium, the shielding element material can include any of tungsten, tin, molybdenum, or indium. The shield elements can include silicon and gold alloy components. Alternatively, the shielding element material can include chemical elements identical to those of the liquid source material, since these satisfy the criteria discussed above.

It will thus be seen that the invention efficiently attains the objects set forth above, among those made apparent from the preceding description. In particular, the invention provides an ion source assembly affording extended source life and enhanced short- and long-term stability of ion beam current.

It will be understood that changes may be made in the above construction and in the foregoing sequences of operation without departing from the scope of the invention. For example, other specific combinations of materials having the characteristics set forth above can be selected in accordance with the invention. It is therefore intended that all matter contained in the above description or shown in the accompanying drawings be interpreted as illustrative rather than in a limiting sense.

It is also to be understood that the following claims are intended to cover all of the generic and specific features of the invention as described herein, and all statements of the scope of the invention which, as a matter of language, might be said to fall therebetween.

Having described the invention, what is claimed as new and secured by Letters Patent is:

1. A method of constructing an ion source assembly of the type including (i) an ion generating element for providing a reservoir of flowing liquid source material, (ii) accelerating elements for providing an electric field around the ion generating element, and (iii) shielding elements for physically shielding the accelerating elements from ions that diverage from a selected path, wherein said ion generating element, accelerating elements and shielding elements generate an ion beam normally having a selected ion current, said ion beam being defined from ions generated by cooperation of the ion generating element and accelerating elements, the method comprising the steps or
   constructing the ion generating element to have at least a first surface including at least a first selected source material, and
   configuring at least a shielding element from a selected material, the configuring step including the step of selecting said shielding element material to include atoms of elements which, if backsputtered onto the first surface of the ion generating element during operation of the ion source assembly, do not substantially degrade ion source performance over time.

2. A method according to claim 1 wherein the selecting step includes the step of selecting a material including atoms capable of alloying with the liquid source metal, during operation of the ion source assembly and backsputtering of the atoms of the selected material onto the first surface of the ion generating element, so that ion source performance is not substantially degraded over time.

3. A method according to claim 1 wherein the selecting step includes the step of selecting a material including atoms which, if backsputtered onto the first surface of the ion generating element during operation of the ion source assembly, accrete to form a structure on the first surface of the ion generating element having a selected microstructure so that ion source performance is not substantially degraded over time.

4. A method according to claim 1 wherein the selecting step includes the step of selecting a material including atoms which, if backsputtered onto the first surface of the ion generating element during operation of the ion source assembly, do not substantially modify electric field characteristics of the ion generating element, accelerating elements, and shield elements, collectively, over time.

5. A method according to claim 1 wherein the selecting step includes the step of selecting a material including atoms which, if backsputtered onto the first surface of the ion generating element during operation of the ion source assembly, do not substantially alter the flow of liquid source material about the ion generating element during operation of the ion source assembly.

6. A method according to claim 3, wherein the selecting step includes the step of selecting a material including atoms which, if backsputtered onto the first surface of the ion generating element during operation of the ion source assembly, accrete to form a structure on the first surface of the ion generating element having a substantially porous microstructure.

7. A method according to claim 1, wherein the constructing step includes the step of constructing the ion generating element so that the first surface of the ion generating element includes gallium, and the configuring step includes the step of configuring at least one shielding element to include tin.

8. A method according to claim 1, wherein the constructing step includes the step of constructing the ion generating element so that the first surface of the ion generating element includes gallium, and the configuring step includes the step of configuring at least one shielding element to include tungsten.

9. A method according to claim 1, wherein the constructing step includes the step of constructing the ion generating element so that the first surface of the ion generating element includes gallium, and the configuring step includes the step of configuring at least one shielding element to include molybdenum.

10. A method according to claim 1, wherein the constructing step includes the step of constructing the ion generating element so that the first surface of the ion generating element includes gallium, and the configuring step includes the step of configuring at least one shielding element to include indium.

11. A method according to claim 1, wherein the selecting step includes the step of selecting a material which form a solution when alloyed with the selected source metal upon backsputtering of atoms of said selected material onto the first surface of the ion generating element during operation of the ion source, said solution having a melting point lower than an operating temperature of the ion source assembly, so that backsputtering of atoms of said selected material onto the first surface of the ion generating element does not substantially degrade ion source performance.

12. A method according to claim 1 wherein the selecting step includes the step of selecting a material including atoms of the liquid source material.

13. A method according to claim 1, wherein the configuring step includes the step of configuring at least said shielding element from sectors of selected materials, the configuring step including the step of selecting each said sector material to include atoms of elements which, if backsputtered onto the first surface of the ion generating element during operation of the ion source, do not substantially degrade ion source performance.

14. A method according to claim 1, wherein the configuring step includes the step of configuring a plurality of optical elements along a selected path of the ion beam generated by the ion generating element and accelerating elements to include atoms of elements which, if backsputtered onto the first surface of the ion generating element during operation of the ion source, do not substantially degrade ion source performance.

15. In an ion source assembly of the type including an ion generating element for providing a reservoir of flowing liquid source material, (ii) accelerating elements for providing an electric field around the ion generating element, and (iii) shielding elements for physically shielding the accelerating elements from ions that diverge from a selected path, wherein said ion generating element, accelerating elements and shielding elements generate an ion beam normally having a selected ion current, said ion beam being defined from ions generated by cooperation of the ion generating element and accelerating elements, the improvement comprising an ion generating element having at least a first surface including at least a first selected source material, and at least one shielding element constructed from a material selected to include atoms of elements which, if backsputtered onto the first surface of the ion generating element during operation of the ion source, do not substantially degrade ion source performance over time.

* * * * *

(12) EX PARTE REEXAMINATION CERTIFICATE (5147th)
United States Patent
Ward et al.

(10) Number: US 5,034,612 C1
(45) Certificate Issued: Jul. 19, 2005

(54) ION SOURCE METHOD AND APPARATUS

(75) Inventors: Billy W. Ward, Rockport, MA (US); Randall G. Percival, Raymond, NH (US)

(73) Assignee: FEI Company, Hillsboro, OR (US)

Reexamination Request:
No. 90/006,481, Dec. 11, 2002

Reexamination Certificate for:
Patent No.: 5,034,612
Issued: Jul. 23, 1991
Appl. No.: 07/622,178
Filed: Dec. 3, 1990

Related U.S. Application Data

(63) Continuation of application No. 07/358,403, filed on May 26, 1989, now abandoned.

(51) Int. Cl.$^7$ .............................................. H01J 27/00
(52) U.S. Cl. .............................. 250/423 R; 250/423 F; 250/424; 313/230; 313/359.1; 313/361.1; 313/363.1
(58) Field of Search .......................... 250/423 R, 423 F; 313/230, 359.1, 361.1, 363.1; 219/121.12, 121.15, 121.19

(56) References Cited

PUBLICATIONS

C.S. Galovich., "Effects of Backsputtered Material on Gallium Liquid Metal Ion Source Behavior," *Journal of Applied Physics*, vol. 63, No. 10 (1988).

C.S. Galovich and A. Wagner., "A New Method for Improving Gallium Liquid Metal Ion Source Stability," *Journal of Vacuum Science and Technology B*, vol. 6, No. 6 (1988).

*Primary Examiner*—John R Lee

(57) ABSTRACT

Ion source methods and apparatus include an ion generating element for providing a reservoir of flowing liquid source material, accelerating elements for providing an electric field around the ion generating element, and shielding elements. The shielding element is constructed from a material including atoms which, if back-sputtered onto the ion generating element, do not substantially degrade ion source performance.

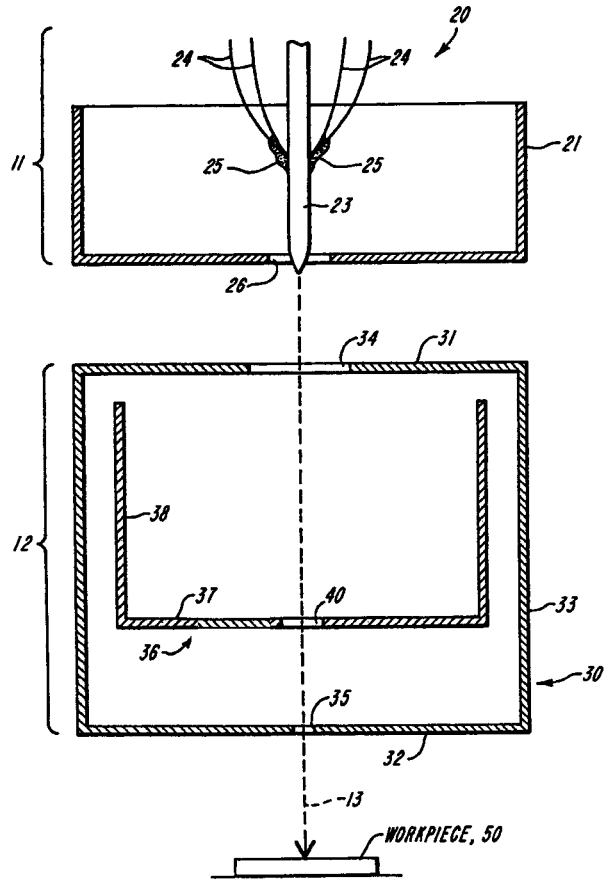

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–10 and 12–15 is confirmed.

Claim 11 is determined to be patentable as amended.

New claims 16–53 are added and determined to be patentable.

11. A method according to claim 1, wherein the selecting step includes the step of
selecting a material which [form] *forms* a solution when alloyed with the selected source metal upon backsputtering of atoms of said selected material onto the first surface of the ion generating element during operation of the ion source, said solution having a melting point lower than an operating temperature of the ion source assembly, so that backsputtering of atoms of said selected material onto the first surface of the ion generating element does not substantially degrade ion source performance.

*16. A method according to claim 1, wherein configuring at least a shielding element from a selected material includes configuring a plate element from a selected material.*

*17. A method according to claim 16, wherein configuring a plate element from a selected material includes configuring a generally cylindrical sidewall by the plate element.*

*18. A method according to claim 16, wherein the accelerating elements for providing an electric field around the ion generating elements comprise an accelerating electrode positioned farther down the beam path than the plate element and having an aperture for passage of the ion beam.*

*19. A method according to claim 16, wherein the accelerating elements for providing an electric field around the ion generating elements comprise two electrode plates and wherein configuring a plate element from a selected material includes positioning the plate element between the two electrode plates.*

*20. A method according to claim 16, wherein configuring a plate element includes configuring a plate element adjacent to an accelerating element.*

*21. A method according to claim 1, wherein configuring at least a shielding element includes positioning a shielding element between two accelerating electrodes.*

*22. A method according to claim 1, wherein configuring at least a shielding element includes configuring a shielding element that comprises an optical element.*

*23. A method according to claim 22, wherein configuring a shielding element includes configuring a shielding element having a layer of material that includes atoms of elements which, if backsputtered onto the first surface of the ion generating element during operation of the ion source assembly, do not substantially degrade ion source performance over time.*

*24. A method according to claim 1, wherein configuring a shielding element includes configuring a shielding element having a layer of material that includes atoms of elements which, if backsputtered onto the first surface of the ion generating element during operation of the ion source assembly, do not substantially degrade ion source performance over time.*

*25. A method according to claim 1, wherein configuring at least a shielding element includes configuring a shielding element that comprises a beam-forming or beam defining element.*

*26. A method according to claim 1, wherein configuring at least a shielding element includes configuring a shielding element supported by an electrode.*

*27. A method according to claim 1, wherein configuring at least a shielding element includes configuring an extractor as a shielding element.*

*28. A method according to claim 1, wherein configuring at least a shielding element includes configuring an aperture plate as a shielding element.*

*29. A method according to claim 1, wherein configuring at least a shielding element includes configuring a shielding element upstream from multiple accelerating electrodes.*

*30. An ion source assembly according to claim 15, wherein the at least one shielding element comprises a plate element.*

*31. An ion source assembly according to claim 30, wherein the plate element includes a generally cylindrical sidewall.*

*32. An ion source assembly according to claim 30, wherein the plate element includes a plate element aperture and is positioned between the ion generating element and an accelerating electrode having a second aperture.*

*33. An ion source assembly according to claim 32, wherein the plate element aperture has a first diameter and the second aperture has a second diameter, the first diameter being larger than the second diameter.*

*34. An ion source assembly according to claim 30 wherein the plate element is positioned between a first accelerating electrode that is positioned between the plate element and the ion generating element, and a second accelerating electrode, positioned on the opposite side of the plate element from the ion generating element.*

*35. An ion source assembly according to claim 15, wherein the at least one shielding element comprises an optical element.*

*36. An ion source assembly according to claim 35 wherein the at least one shielding element includes a layer of material including atoms of elements which, if backsputtered onto the first surface of the ion generating element during operation of the ion source assembly, do not substantially degrade ion source performance over time.*

*37. An ion source assembly according to claim 15, wherein the at least one shielding element comprises a beam-forming or beam defining element.*

*38. An ion source assembly according to claim 15, wherein the at least one shielding element is supported by an electrode element.*

*39. An ion source assembly according to claim 15, wherein the accelerating elements include multiple electrodes downstream of the at least one shielding element.*

*40. An ion source assembly according to claim 15, wherein the at least one shielding element comprises an aperture surface.*

*41. An ion source assembly according to claim 15, wherein the at least one shielding element comprises an extractor.*

42. An ion source assembly according to claim 15, wherein the at least one shielding element comprises a material including atoms capable of alloying with the liquid source metal, during operation of the ion source assembly and backsputtering of the atoms of the selected material onto the first surface of the ion generating element, so that ion source performance is not substantially degraded over time.

43. An ion source assembly according to claim 15, wherein the at least one shielding element comprises a material including atoms which, if backsputtered onto the first surface of the ion generating element during operation of the ion source assembly, accrete to form a structure on the first surface of the ion generating element having a selected microstructure so that ion source performance is not substantially degraded over time.

44. An ion source assembly according to claim 15, wherein at least one shielding element comprises a material including atoms which, if backsputtered onto the first surface of the ion generating element during operation of the ion source assembly, do not substantially modify electric field characteristics of the ion generating element, accelerating elements, and shield elements, collectively, over time.

45. An ion source assembly according to claim 15, wherein the at least one shielding element comprises a material including atoms which, if backsputtered onto the first surface of the ion generating element during operation of the ion source assembly, do not substantially alter the flow of liquid source material about the ion generating element during operation of the ion source assembly.

46. An ion source assembly according to claim 45, wherein the at least one shielding element comprises a material including atoms which, if backsputtered onto the first surface of the ion generating element during operation of the ion source assembly, accrete to form a structure on the first surface of the ion generating element having a substantially porous microstructure.

47. An ion source assembly according to claim 15, wherein the first surface of the ion generating element includes gallium, and the at least one shielding element comprises includes tin.

48. An ion source assembly according to claim 15, wherein the first surface of the ion generating element includes gallium, and the at least one shielding element includes tungsten.

49. An ion source assembly according to claim 15, wherein the first surface of the ion generating element includes gallium, and the at least one shielding element to includes molybdenum.

50. An ion source assembly according to claim 15, wherein the first surface of the ion generating element includes gallium, and the at least one shielding element to include indium.

51. An ion source assembly according to claim 15, wherein the at least one shielding element comprises a material which forms a solution when alloyed with the selected source metal upon backsputtering of atoms of said selected material onto the first surface of the ion generating element during operation of the ion source, said solution having a melting point lower than an operating temperature of the ion source assembly, so that backsputtering of atoms of said selected material onto the first surface of the ion generating element does not substantially degrade ion source performance.

52. An ion source assembly according to claim 15, wherein the at least one shielding element includes atoms of the liquid source material.

53. An ion source assembly according to claim 15, wherein the at least one shielding element comprises sectors that include atoms of elements which, if backsputtered onto the first surface of the ion generating element during operation of the ion source, do not substantially degrade ion source performance.

* * * * *